United States Patent [19]

Cordes et al.

[11] 3,849,789

[45] Nov. 19, 1974

[54] SCHOTTKY BARRIER DIODES

[75] Inventors: Linus F. Cordes; Marvin Garfinkel, both of Schenectady, N.Y.

[73] Assignee: General Electric, Schenectady, N.Y.

[22] Filed: Nov. 1, 1972

[21] Appl. No.: 302,800

[52] U.S. Cl. .................... 357/15, 357/13, 357/89, 357/90, 148/175

[51] Int. Cl. .................... H01l 5/00

[58] Field of Search .........317/235 AN, 235 AM, 317/235 VA, 235 T, 235 R

[56] References Cited

UNITED STATES PATENTS

| | | | |
|---|---|---|---|
| 2,790,037 | 4/1957 | Shockley | 179/171 |
| 3,006,791 | 10/1961 | Webster | 148/33 |
| 3,388,000 | 6/1968 | Waters et al. | 117/212 |
| 3,419,764 | 12/1968 | Kasugai et al. | 317/234 |
| 3,451,912 | 6/1969 | D'Heurle et al. | 204/192 |
| 3,486,086 | 12/1969 | Soshea | 317/235 |
| 3,500,144 | 3/1970 | Wetterau et al. | 317/236 |
| 3,523,046 | 8/1970 | Grochowski et al. | 148/175 |
| 3,612,958 | 10/1971 | Saito et al. | 317/234 |
| 3,638,300 | 1/1972 | Foxhall et al. | 29/589 |
| 3,646,411 | 2/1972 | Iwasa | 317/235 UA |
| 3,652,905 | 3/1972 | Page | 317/234 R |
| 3,663,320 | 5/1972 | Maruyama et al. | 148/175 |
| 3,675,316 | 7/1972 | Axelrod | 29/576 |
| 3,742,317 | 6/1973 | Shao | 317/235 R |

OTHER PUBLICATIONS

R. Warner et al., "Integrated Circuits–Design Principles and Fabrication," McGraw-Hill, 1965, p. 70–73.

C. Thomas et al., "Impurity Distrib. in Epitaxial Silicon Films," J. of the Electrochem. Soc., Nov., 1962, pp. 1055–1061.

Corson and Lorrain, "Introd. to E–M Fields and Waves," 1962, Freeman & Co., pp. 168–170.

*Primary Examiner*—Rudolph V. Rolinec
*Assistant Examiner*—Joseph E. Clawson, Jr.
*Attorney, Agent, or Firm*—Julius J. Zaskalicky; Joseph T. Cohen; Jerome C. Squillaro

[57] ABSTRACT

The series resistance of a Schottky barrier diode is reduced by grading the net activator concentration in the epitaxial layer of the diode from a minimum value at the face thereof at the barrier to a maximum value at the other face thereof in accordance with various profiles. In comparison to an epitaxial layer which is uniform in concentration and which is able to withstand a predetermined reverse voltage, the profile is set so that the diode concurrently is able to withstand the same predetermined voltage. Suitable profiles are one step, multistep and continuously graded.

6 Claims, 9 Drawing Figures

SCHOTTKY BARRIER DIODES

The present invention relates in general to Schottky barrier diodes and in particular to Schottky barrier diodes of reduced series resistance.

In a Schottky barrier diode which includes a body of semiconductor material and a metallic barrier contact thereto, the forward voltage drop across the terminals of the diode is constituted of a voltage drop across the barrier and a voltage drop across the resistance of the body of semiconductor material in series with the terminals, referred to as the series resistance of the diode. In many applications it is desirable to reduce the series resistance of the diode as it represents power consumption and hence reduces the efficiency of the diode. The series resistance may be reduced while maintaining constant the voltage at which the diode breaks down under reverse bias conditions by increasing the cross-sectional area of the diode. Such an expedient, however, increases the reverse current and, in addition, requires utilization of additional valuable semiconductor material.

Accordingly, an object of the present invention is to provide improvements in Schottky barrier diodes in which series resistance thereof is reduced without compromising the reverse voltage breakdown characteristics of the device and without requiring an increase in the cross-sectional area of the diode or utilization of additional semiconductor material.

It is also an object of the present invention to provide a Schottky barrier diode having smaller cross-sectional area and utilizing less semiconductor material while providing the same or less series resistance than a conventional diode having the same value of reverse breakdown voltage.

In accordance with an illustrative embodiment of the present invention there is provided a layer of semiconductor material of one conductivity type having a pair of opposed planar faces. A conductive member secured to one of the faces forms a surface barrier rectifying contact therewith and an electrode secured to the other face of the layer forms a non-rectifying contact therewith. The net activator concentration of the layer varies with distance from the one face in a manner that the ohmic resistance of the layer between the faces is less than any layer of uniform net activator concentration able to withstand the same avalanche breakdown as the layer.

The novel features which are believed to be characteristic of the present invention are set forth with particularity in the appended claims. The invention itself, both as to its organization and method of operation, together with further objects and advantages thereof may best be understood with reference to the following description taken in connection with the accompanying drawings in which:

Figure 3A:
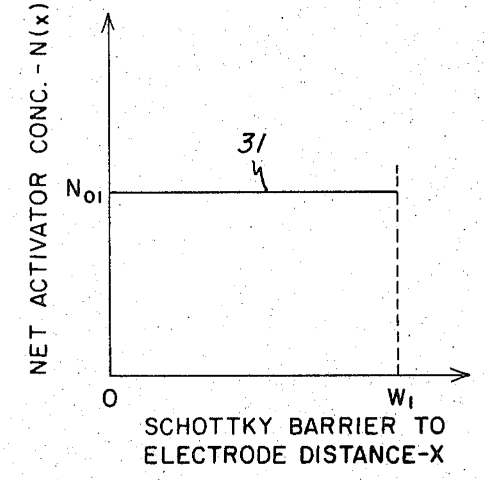

FIG. 3*a* is a graph of the net activator concentration as a function of distance from the barrier of a Shottky barrier diode having an epitaxial layer of uniform net activator concentration.

Figure 3B:
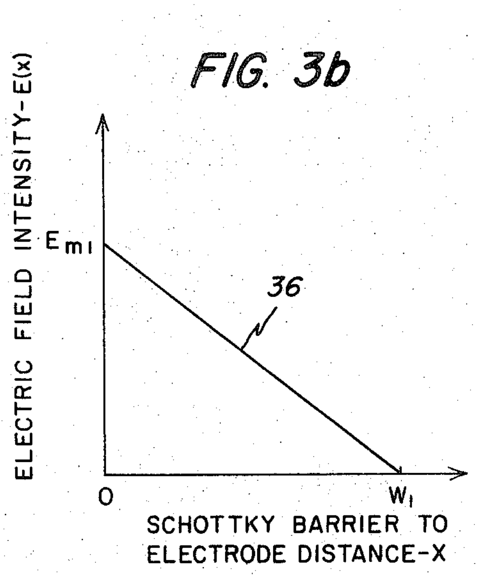

FIG. 3*b* is a graph of the electric field intensity from the barrier to the non-rectifying contact in the epitaxial layer of the diode of FIG. 3*a* showing the variation thereof with distance when maximum reverse voltage is applied to the diode.

Figure 4A:
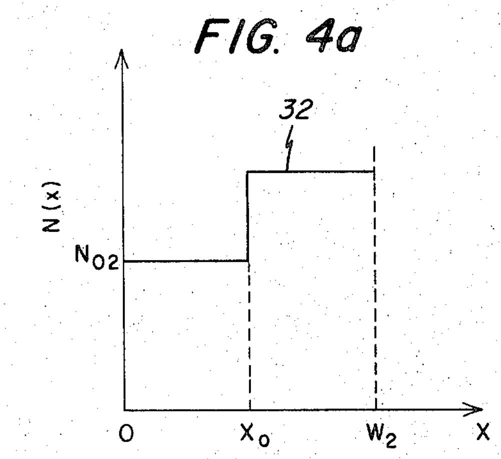

FIG. 4*a* is a graph of the one-step profile of the net activator concentration in the semiconductor layer of a Schottky barrier diode as a function of distance from the barrier thereof in accordance with one aspect of the present invention.

Figure 4B:
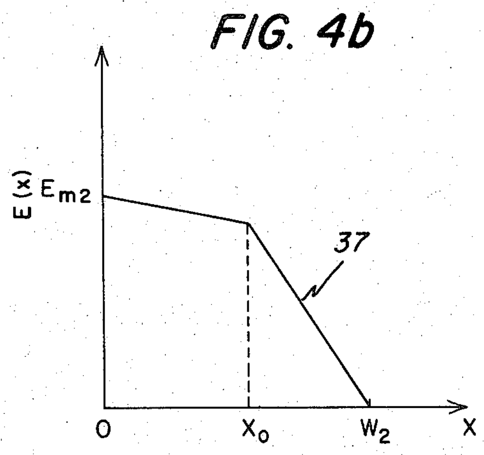

FIG. 4*b* is a graph of the electric field intensity in the semiconductor layer of the Schottky barrier diode of FIG. 4*a* when the semiconductor layer is depleted of majority carriers, that is, under maximum reverse voltage operation.

Figure 5A:
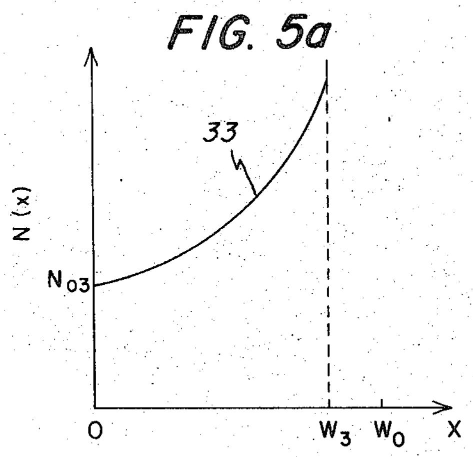

FIG. 5*a* is a graph of the net activator in the semiconductor layer concentration of another Schottky barrier diode in which the net activator concentration varies parabolically with distance from the barrier contact.

Figure 5B:
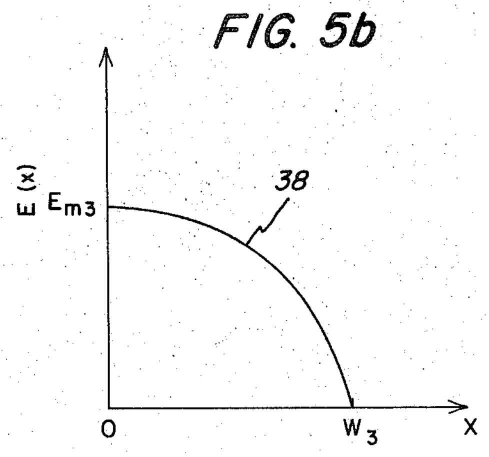

FIG. 5*b* is a graph of the electric field intensity under maximum voltage operation of the diode of FIG. 5*a*.

Figure 6:
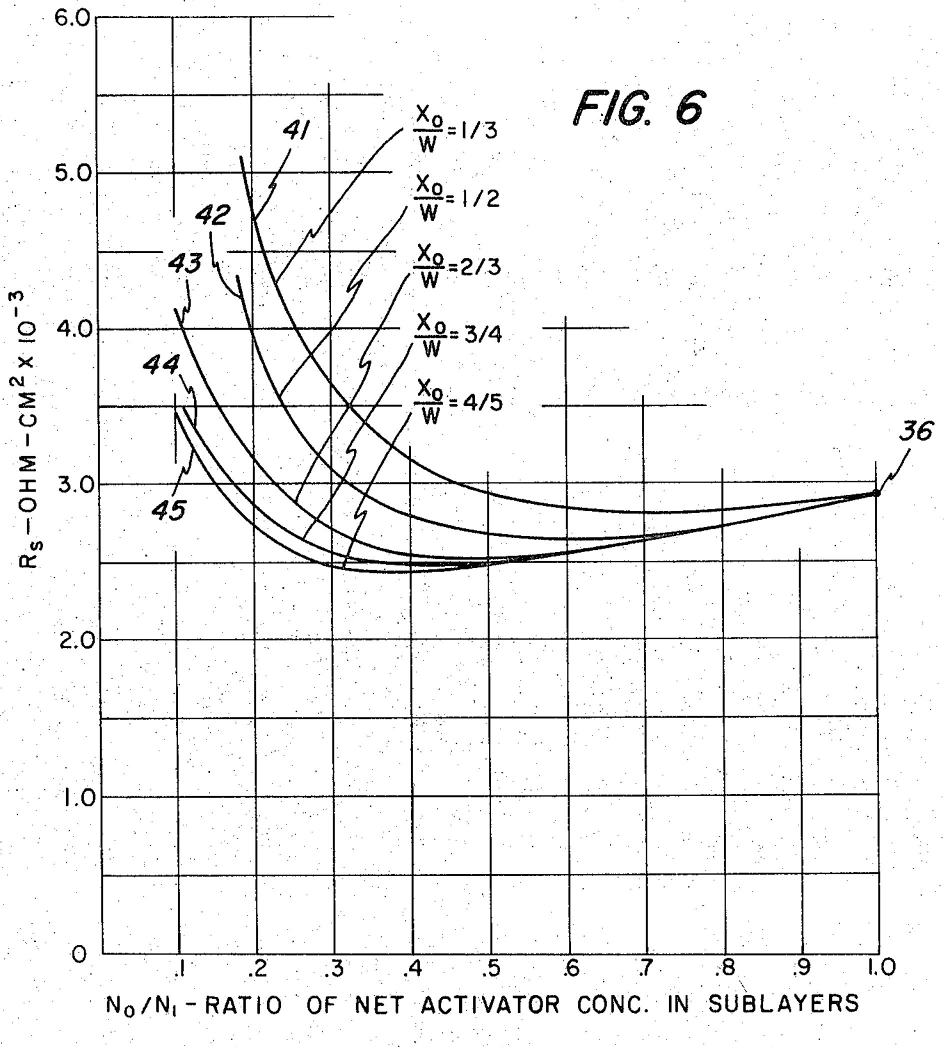

FIG. 6 shows a family of graphs for one-step or two sublayer type net activator distribution such as shown in FIG. 4*a*, for a diode able to withstand a specific maximum reverse voltage in which series resistance is plotted as a function of the ratio of the net activator concentration in the sublayer adjacent the barrier to the sublayer adjacent the other face in contact with the non-rectifying electrode. Each graph is for a different specific value of thickness of the sublayer adjacent the surface barrier in relation to the thickness of the entire epitaxial layer.

Figure 1:
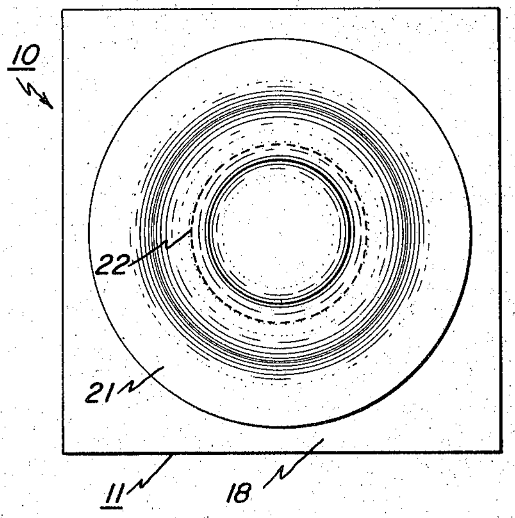
FIG. 1 is a plan view of a Schottky barrier diode embodying the present invention.
Figure 2:
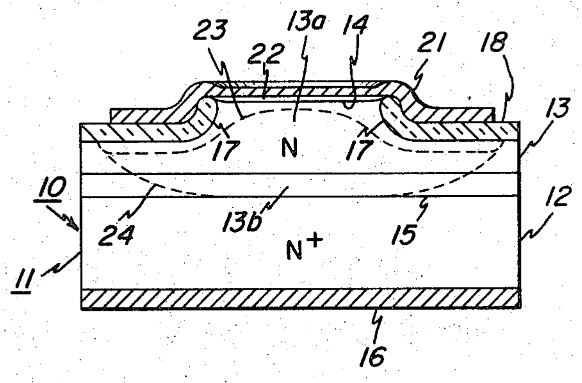
FIG. 2 is an elevation view in section of the diode of FIG. 1.

Referring now to FIGS. 1 and 2, there is shown a diode 10 in accordance with the present invention including the wafer 11 or die having a substrate layer 12 of silicon of low resistivity and a layer 13 of silicon of substantially higher resistivity epitaxially grown thereon. The epitaxial layer 13 has a pair of opposed major faces 14 and 15. The layer 13 is constituted of a sublayer 13a including the face 14 of substantially uniform net activator concentration and sublayer **13*b* including face 15 of substantially uniform and substantially higher net activator concentration than sublayer 13a in accordance with one aspect of the present invention. Techniques for epitaxially growing epitaxial layers of semiconductor materials such as silicon on suitable semiconductor substrates to desired concentrations of activators or impurities is well known to those skilled in the art and will not be elaborated on herein. A surface barrier contact member 22 is formed on face 14 by deposition of a conductive material such as aluminum, tungsten, platinum silicide and the like thereon in a manner well known to those skilled in athe art. The substrate 12 provides non-rectifying contact to the epitaxial layer 13 at the face 15. A thin metal film 16 such as molybdenum depositioned on the substrate provides a non-rectifying contact terminal to the substrate and hence to the epitaxial layer 13. The epitaxial layer 13 has been shown etched down to provide the surface region 17 of relatively large radius to assure that in the operation of the diode under reverse bias conditions electrical breakdown will not occur along the peripheral portions of the diode. A relatively thick layer 18 of silicon dioxide covers the etched down portion and not only protects the surface of the layer 13 but also serves along with metal film member 21 of a metal such as molybdenum extending over the oxide layer 18 to spread the electric field lines of force and further avoid high electric field intensities in the peripheral portions of the diode. The metal layers 16 and 21** form terminals for connecting the diode to an appropriate header or mounting arrangement (not shown) for utilization.

Also shown in FIG. 2, in dotted outline, is a boundary 23 of the depletion region in the epitaxial layer 13 when the diode is reversely biased so as to deplete partially majority carriers from a portion of the wafer included between faces 14 and 15. The contour of the boundary illustrates the electric field distribution in the layer and clearly indicates that high electric field intensities around the peripheral portions of the device which would produce premature breakdown under high reverse voltages do not occur. Dotted outline 24 shows the boundary of the depletion region of the diode when a sufficiently large reverse voltage is applied to the diode to cause it to extend to the non-rectifying contact or electrode 12. This condition is referred to as "punch through" and preferably is set in the design of the diode for power applications to coincide with reverse voltage breakdown of the diode. The device of FIG. 1 may be formed on a larger wafer including a substrate and epitaxial layer corresponding to substrate layer 12 and epitaxial layer 13, respectively, and after final processing the large finished wafer is suitably diced to form the individual diode elements for packaging in a header.

For power rectifier applications, the characteristics of a surface barrier diode which would be specified are the reverse breakdown voltage, reverse current and forward voltage drop for maximum rated current. On the one hand, it is desirable to provide an epitaxial layer of low resistivity material so as to reduce the forward voltage drop of the rectifier, but on the other hand, if low resistivity material is utilized high electric fields produced in the vicinity underlying the surface barrier contact under reverse voltage conditions would cause breakdown of the material at a lower voltage than if a higher resistivity material were used. Accordingly, the resistivity of the material and the thickness are selected so that the necessary forward and reverse operating parameters are realized.

Reference is now made to FIG. 3A which shows the impurity or net activator concentration in a Schottky barrier diode in which the active layer, that is, the epitaxial layer referred to in connection with FIGS. 1 and 2, has uniform net activator concentration. To provide such a diode which will withstand a predetermined high reverse voltage and provide a low forward current drop for particular semiconductor and contact materials, for example, silicon and aluminum, a designer would proceed in the following manner. Initially, the net activator concentration which will provide the desired present voltage breakdown capabilities is determined from standard charts of reverse breakdown voltage as a function of net activator concentration, such as shown on page 121 of "Physics of Semiconductor Devices" by S. M. Sze, published by John Wiley and Sons, Inc. The resistivity corresponding to the net activator concentration is then the minimum resistivity useable for the epitaxial layer. Next, the depletion width in a layer of this resistivity for a step junction is determined by formula or also from standard charts such as the charts shown on page 89 of the aforementioned text. As it is desirable to have the depletion region of the epitaxial layer contact the non-rectifying contact at the value of voltage at which the epitaxial layer breaks down, the epitaxial layer is grown to this thickness. If the epitaxial layer were made thicker, the series resistance of the diode would be needlessly augmented. If the epitaxial layer were thinner, "punched through" would occur at a voltage less than the maximum voltage which the seimiconductor material could withstand, and accordingly the maximum breakdown capability of the material would not be reached. Having the information on resistivity and the thickness of the epitaxial layer, the series resistance of the diode may be readily calculated or determined from standard charts such as shown on page 43 of the aforementioned text. The series resistance of such a device can be reduced by increasing the cross-sectional area. However, increasing cross-sectional area entails utilization of more semiconductor material as well as increasing the reverse leakage current of the diode.

In accordance with the present invention the series resistance of the diode is reduced not by increasing the cross-sectional area of the semiconductor layer but by providing a particular profile or grading of the net activator concentration between the barrier and a non-rectifying contact, that is, the net activator concentration of the layer is set at a minimum valve at the surface barrier and is increased with distance to substantially a maximum value at the non-rectifying contact. With this distribution of activators when the epitaxial layer is depleted of majority carriers in response to a predetermined reverse voltage applied between the electrodes and the diode, the electric field at the surface barrier is less than or at a value which would produce avalanche breakdown therein. The distribution is also set so that the resistance of the layer is less than any layer of uniform net activator concentration able to withstand the same avalanche breakdown voltage. One such form of distribution is a one-step distribution in which the epitaxial layer is divided into two sublayers, one adjacent the surface layer and the other adjacent the non-rectifying contact. The net activator concentration in the sublayer adjacent the barrier is uniform and is set at a minimum value. The net activator concentration in the sublayer adjacent the non-rectifying contact is also uniform and is set at a substantially higher value. The ratio of the thickness of one of the sublayers to the thickness of the entire layer may be varied and still meet the aforementioned requirements. The device of FIG. 2 incorporates a one-step profile of impurity distribution which is optimum for this form of distribution for a device able to withstand a reverse voltage of 200 volts. This optimum distribution is one in which the sublayer 13A is .8 of width of the layer 13 and the net activator concentration $N_0$ in sublayer 13A is one-third the net activator concentration ($N_1$) in sublayer 13b. FIG. 4A shows a net activator concentration profile in which the two sublayers are of equal width and in which the ratio of net activator concentrations $N_0/N_1$ is about 0.6. For structures with a one-step distribution, the series resistance is substantially less than for the structure in which the net activator concentration is uniform over the entire layer as will be explained in more detail below in concentration with FIG. 6.

Reference is now made to FIGS. 3A, 4A and 5A which show, respectively, graphs 31, 32 and 33 of impurity or net activator concentration $N(x)$ vs distance $x$ through the epitaxial layer of a Schottky barrier diode measured from the barrier to the opposing face of the epitaxial layer to which the non-rectifying contact is made for various net activator distributions. The ordinates of the graphs are drawn to the same scale, and the abscissas of the graphs are also drawn to the same scale. FIG. 3A shows the impurity distribution in the epitaxial layer of a Schottky barrier diode in which the impurity concentration is uniform. FIG. 4A shows the impurity distribution in the epitaxial layer of a Schottky barrier diode in which the impurity concentration varies in one step from a minimum value in the sublayer adjacent the barrier to a maximum in the sublayer in the surface adjacent the non-rectifying contact. The width of each of the sublayers is shown identical. FIG. 5A shows the impurity distribution in the epitaxial layer of a Schottky barrier diode in which the impurity concentration increases parabolically from a minimum value at the surface barrier to a maximum value at the non-rectifying contact. The distances $W_1$, $W_2$ and $W_3$ represent the widths of the depletion regions in the epitaxial layers in the three cases in response to the application of the same reverse voltage in each of the three cases and of a value which will cause breakdown at the barrier face of the epitaxial layer. Of course, with the non-rectifying contacts located at these distances "punch through" occurs, ideally, coincidentally at breakdown voltage. The depletion widths or thickness for the three cases are different. Successively smaller widths are utilized for the three cases as will be explained below.

Reference is now made to FIGS. 3B, 4B and 5B which show, respectively, graphs 36, 37 and 38 of electric field intensity in the epitaxial layers of the Schottky barrier devices of FIGS. 3A, 4A and 5A respectively. Electric field intensity in all of the graphs is plotted along the ordinate to the same scale and distance from the barrier interface is plotted along the abscissa to the same scale used for graphs of FIGS. 3A, 4A and 5A. These graphs show the manner in which the electric field intensity varies in the epitaxial layers thereof when the same maximum voltage is applied in all three cases and shows how the electric field intensity increases from substantially zero at the non-rectifying contact to a maximum value at the surface barrier face. It should be noted that though the devices will withstand the same reverse voltage, the electric field intensity existing at the barrier interface may be different for each of the three cases and this difference is indicated by different values of the maximum electric field intensity.

The graphs of FIGS. 3B, 4B and 5B are derived from the impurity distributions of FIGS. 3A, 4A and 5A by the integration of thenet activator impurity concentration therein over a distance starting at the non-rectifying contact and terminating at the surface barrier contact. Of course, the integral of the electric field intensity over the distance from the non-rectifying contact to the surface barrier would represent the applied reverse voltage. Accordingly, the area under the graphs 36, 37 and 38 are equal, as the epitaxial layers are designed to withstand the same reverse voltage. In FIG. 3B the electric field intensity increases from zero at the non-rectifying contact at a constant rate to the maximum electric field intensity $E_{ml}$ at the surface barrier. In FIG. 4B the electric field intensity varies from zero at the non-rectifying contact at one rate with distance corresponding to uniform net activator concentration in the sublayer adjacent the non-rectifying contact and at a slower rate with distance corresponding to a lower uniform net activator concentration in the sublayer adjacent the barrier and reaches a maximum value $E_{m2}$, which is lower than $E_{m1}$. Accordingly, even though lower net activator concentration in a semiconductor will result in a lower breakdown field, such lower electric field intensity is produced by the same applied reverse voltage as in FIG. 3B. Also, it is noted that the depletion distance $W_2$ is less than the depletion distance $W_1$. FIG. 5B shows the variation in electric field intensity for a surface barrier diode having an epitaxial layer in which the impurity distribution varies parabolically from a minimum value at the surface barrier interface to a maximum value at the non-rectifying contact. With this profile, the thickness of the layer required $W_3$ is less than the thickness in either of the other two cases of FIGS. 3*b* and 4*b*. Electric field intensity varies parabolically from zero at the point $W_3$ to a value of maximum electric field intensity $E_{m3}$ which is less than the electric field intensity in each of the other two cases of FIGS. 3*b* and 4*b*. The net activator concentration $N(x)$ as a function of distance is defined by the following equation:

$$N(x) = C/(W_0 - x)^{\alpha}$$

where $W_0$ is a fixed arbitrary coordinate greater than the epitaxial layer thickness, $C$ is a constant dependent on $N_0$, the impurity concentration at the barrier and also dependent on the fixed coordinate $W_0$.

In each of these cases the rectifier is designed to withstand the same reverse breakdown voltage represented by a constant area under each of the graphs 36, 37 and 38 of FIGS. 3B, 4B and 5B. For the impurity concentration at the surface barrier for each of the cases, the electric field intensity denoted respectively, $E_{m1}$, $E_{m2}$ and $E_{m3}$ turns out to be a value corresponding to the breakdown voltage which the semiconductor material having the net activator concentrations indicated, namely $N_{01}$, $N_{02}$ and $N_{03}$ is able to withstand. As noted, the depletion distances $W_1$, $W_2$ and $W_3$ are successively smaller. This indicates that the length of the smiconductor material between the surface barrier and the non-rectifying contact is successively less in these cases. It should be noted that the resistivity of the semiconductor material is an inverse function of net activation concentration. Accordingly, it is seen that the effect of grading impurity concentrations is to reduce the width of the epitaxial layer while increasing the resistivity adjacent the surface barrier and substantially decreasing the resistivity adjacent the non-rectifying contact. The net result of these two effects when properly arranged is to reduce the series resistance of the epitaxial layer in the device. Such a proportioning enables maximum reverse voltage to be obtained with minimum series resistance for a particular material.

While FIG. 5A shows a parabolic distribution of impurities a more generalized relationship, though not optimum, is the following $$N(x) = C/(W_0 - x)^{\alpha}$$

where alpha is less than one and, positive and $W_0$ is an arbitary constant greater than the thickness of the epitaxial layer. The maximum reduction in series resistance obtainable is achieved with a parabolic profile of net activator concentration i.e. with $\alpha = 1/2$. With a parabolic profile a reduction of series of resistance of 25 percent is obtainable.

While in FIG. 2, two sublayers of equal widths and different concentrations has been shown. It is readily apparent that a plurality of sublayers, which may be of equal or unequal width but arranged so that the net impurity concentration increases successively from layer to layer starting from the surface barrier, may be utilized to achieve the result of maintaining constant breakdown voltage while reducing the series resistance of the layer. When a large number of such sublayers are utilized and arranged so that the impurity concentration in successive layers varies according to the parabolic relationships set forth in connection with FIG. 5A, the maximum reduction in series resistance is realized.

The single step or two sublayer case of FIG. 4A in which the widths of each of the two sublayers are the same does not yield optimum reduction in series resistance. Both the relative widths of the sublayers and the relative net activator concentrations thereof may be varied, while meeting the requirements that the device be able to withstand the same breakdown voltage, to obtain different series resistance values. As the ratio of width $X_0$ of the sublayer adjacent the surface barrier in relation to the total width $W$ of the layer is varied and the net activator impurity concentration $N_0$ of sublayer adjacent the surface barrier is varied in relation to the net activator concentration $N_1$ in the other sublayer, different resistance values are obtained. FIG. 6 shows a family of graphs of series resistance of the semiconductor layer in a surface barrier diode utilizing silicon in which the distribution has a single step as a function of the ratio of the net activator concentration $N_0$ of the sublayer adjacent the surface barrier to the net activator concentration $N_1$ in the sublayer adjacent the non-rectifying contact for devices able to withstand a reverse voltage of 200 volts before breaking down. Each graph corresponds to a respective different thickness $X_0$ of sublayer adjacent the surface barrier in relation to the thickness of the epitaxial layer $W$. It should be noted that the total width W of the layer will vary as the net impurity concentration ratio $N_0/N_1$ varies and also as the ratio $X_0/W$ varies. Graphs 41, 42, 43, 44 and 45 correspond, respectively, to ratios of $X_0/W$ of 1/3, 1/2, 2/3, 3/4 and 4/5. The series resistance of a layer of uniform net activator concentration is used as a reference. This layer has a net activator concentration of $2 \times 10^{15}/cm^3$ and a length of $11.4 \times 10^{-4}$ cm. Under these conditions utilizing the procedure described above, the device would withstand a voltage of 200 volts and would provide a series resistance of 2.95 ohm-cm$^2$ times $10^{-3}$. This point is indicated as point 36 on the graph. Accordingly, using the ratio of $N_0$ to $N_1$ and the width indicated for each of the graphs, the series resistance may be readily determined, for each of the cases. As $X_0$ is increased from 1/3 $W$ and correspondingly the ratio of $N_0$ to $N_1$ is decreased, a minimum point for series resistance is reached when $X_0$ equals 4/5 $W$ and the relative concentration is 0.35. At higher values of $X_0$ the graphs would flatten out below the 2.95 ohm-cm$^2$ $\times 10^{-3}$ ordinate line and the minimum point would rise. Accordingly, the value indicated is the optimum reduction in series resistance over the value obtained utilizing a semiconductor of uniform net activator concentration. This value is $2.48 \times 10^{-3}$ ohm-cm$^2$ which represents a 16 percent reduction in series resistance.

While it has been noted that the series resistance of a rectifier may be reduced appreciably utilizing a graded variation in impurity concentration, resistance could also be maintained the same while reducing the cross-sectional area thereby reducing reverse current.

While the active graded layer of the Schottky diodes disclosed have been indicated as epitaxial layers, it is apparent that such layers may be formed by processes other than epitaxial growth, such as diffusion and ion implantation. for example.

While the invention has been described in specific embodiments, it will be appreciated that modifications such as those described above may be made by those skilled in the art and it is intended by the appended claims to cover all such modifications and changes as fall within the true spirit and scope of the invention.

What we claim as new and desire to secure by Letters Patent of the United States is:

1. A Schottky barrier diode comprising
a layer of semiconductor material of one conductivity type having a pair of opposed faces,
a conductive member secured to one of said faces to form a Schottky barrier rectifying contact therewith,
a substrate member of semiconductor material of said one conductivity type and low resistivity in relation to said layer secured to the other face of said layer to form a non-rectifying contact therewith,
said layer being divided into a plurality of sublayers each of uniform net activator concentration, the net activator concentration of a sublayer being greater than the net activator concentration of a preceding sublayer starting from the sublayer adjacent said conductive member,
each of said sublayers extending beyond the peripheral portions of said Schottky barrier rectifying contact.
the net activator concentration and the thicknesses of said sublayers being set such that the value of reverse voltage applied between said conductive member and said substrate member at which depletion in said layer extends from said one face to said other face thereof produces a value of electric field at said one face which is equal to or less than the value of electric field at which avalanche breakdown occurs at said one face.

2. The diode of claim 1 in which said sublayers are two in number, in which the thickness of the sublayer adjacent the conductive member is greater than the thickness of the sublayer adjacent the electrode, and in which the net activator concentration of the sublayer adjacent said electrode is at least twice the net activator concentration of said sublayer adjacent said conductive member.

3. The diode of claim 2 in which the thickness of the sublayer adjacent the conductive member is four times the thickness of the other sublayer, and in which the net activator concentration of the other sublayer is three times the net activator concentration of the sublayer adjacent the conductive member.

4. The diode of claim 1 in which said semiconductor material is silicon.

5. A Schottky barrier diode comprising
a layer of semiconductor material of one conductivity type having a pair of opposed faces,
a conductive member secured to one of said faces to form a Schottky barrier rectifying contact therewith,
an electrode secured to the other face of said layer to form a non-rectifying contact therewith, the net activator concentration in said layer varying from a minimum value at said one face to a maximum value at said other face according to the relationship $$N(x) = C/(W_0 - x)^\alpha$$

where $C$ is a constant, $W_0$ is an arbitrary distance greater than the width of the layer, $x$ is the distance in the layer from the barrier, and $\alpha$ is a positive fraction less than one, the net activator concentration in said layer at said surface and the thickness of said layer being set such that the value of reverse voltage applied between said conductive member and said electrode at which depletion in said layer extends from said one face to said other face thereof produces a value of electric field at said one face which is equal to or less than the value of electric field at which avalanche breakdown occurs at said one face.

6. The diode of claim 5 in which $\alpha$ is one-half.

* * * * *